United States Patent [19]
Gibbs

[11] Patent Number: 5,640,356
[45] Date of Patent: Jun. 17, 1997

[54] TWO-STAGE DIFFERENTIAL SENSE AMPLIFIER WITH POSITIVE FEEDBACK IN THE FIRST AND SECOND STAGES

[75] Inventor: Gary Austin Gibbs, San Jose, Calif.

[73] Assignee: Cypress Semiconductor Corp., San Jose, Calif.

[21] Appl. No.: 578,187

[22] Filed: Dec. 29, 1995

[51] Int. Cl.$^6$ ................................................. G11C 7/00
[52] U.S. Cl. ........................... 365/207; 365/205; 365/208; 327/54
[58] Field of Search ................................. 365/205, 207, 365/208; 327/53, 54

[56] References Cited

U.S. PATENT DOCUMENTS

| | | | |
|---|---|---|---|
| 4,618,785 | 10/1986 | van Tran | 365/190 |
| 5,231,318 | 7/1993 | Reddy | 307/530 |

*Primary Examiner*—David C. Nelms
*Assistant Examiner*—F. Niranjan
*Attorney, Agent, or Firm*—Blakely, Sokoloff, Taylor & Zafman LLP

[57] ABSTRACT

An improved sense amplifier for receiving differential inputs and providing an output signal. A level shifting circuit for receiving differential inputs (IN and $\overline{IN}$) is provided. A pre-amplification circuit that is coupled to the level shifting circuit provides gain to the differential outputs. A first inverter is coupled to the pre-amplification circuit and provides high voltage gain to the output signal. The first inverter includes a power port for receiving a power voltage signal and a ground port for receiving a ground signal. A second inverter that has a ground port and a power port is coupled to the pre-amplification circuit. The power port of the first and second inverters are coupled to the power voltage supply through a first transistor. Similarly, the ground port of the first and second inverters are coupled to the ground via a second transistor. The output of the second inverter is coupled to the gate of the first and second transistors and controls the first and second transistors.

5 Claims, 6 Drawing Sheets

TWO-STAGE DIFFERENTIAL SENSE AMPLIFIER WITH POSITIVE FEEDBACK IN THE FIRST AND SECOND STAGES

BACKGROUND OF THE INVENTION

1. Field of the Invention

The present invention relates to an improved sense amplifier.

2. Description of Related Art

Sense amplifiers are used to amplify output signals from semiconductor storage arrays, such as static random access memories (SRAMs), programmable read only memories (PROMs) and programmable logic devices (PLDs). Each of these storage arrays need to be "sensed" to read the data stored in the devices. This data is stored within semiconductor structures in the array which are generally capable of producing only very low level output signals which indicate the data. These output signals are binary, ones or zeros, and the difference between the two binary levels is very small. Accordingly, a sense amplifier is required to amplify the levels of these signals in order to further utilize them.

Most prior art sense amplifiers used in complementary MOS ("CMOS") technologies employ a CMOS clamp at the input to reduce input signal swings and, thus, the propagation delay of data through the sense amplifier. Reducing the delay through these sense amplifiers is important in order to minimize delays in accessing data stored in the device.

In the sense amplifier circuit of the present invention, the input signal appears at terminals IN and $\overline{IN}$. The input signal can, for example, be the signal sensed from the bit line of a Programmable Logic Device (PLD) or Static Random Access Memory (SRAM). Generally, it is a small differential voltage, between about 100 mV to 200 mV.

FIG. 1a is a simplified representation of a dual differential amplifier commonly used in the prior art sense amplifier 20. As shown in FIG. 1a, differential amplifier 200 with differential inputs 205, 215 and single output 206 is controlled by transistor 207. Similarly, differential amplifier 210, which receives differential inputs 205, 215 to generate output-bar 216. The sense amplifier is turned on by an enable signal which drives the gates of transistors 207 and 217.

FIG. 1b is a schematic diagram of prior art sense amplifier 20. As shown in FIG. 1, a typical sense amplifier 30 comprises two differential amplifiers 31, 32. Input 307 and input-bar 317 are applied to the gates of the differential pair of transistors 303, 302, respectively in differential amplifier 31. Similarly input 307 and input-bar 317 apply to the gates of the differential pair of transistors 312, 313, respectively in differential amplifier 32. Tail device 304 in differential amplifier 31 is driven by the node connecting the gates of p-channel gate-coupled devices 300, 301. Also, tail device 314 is driven by the node connecting the gates of p-channel gate-coupled devices 310, 311 in differential amplifier 32.

The prior art sense amplifiers have the following shortcomings. First, these sense amplifiers cannot accept input signals at the power supply voltage (e.g., $V_{cc}$). Specifically, the input signals must be translated down from the power supply voltage to a lower voltage (e.g., 1 V below $V_{cc}$) for the prior art circuits to work properly. Moreover, the gain of the pre-amplifier stage of these prior art circuits is high which increases the delay through the amplifier.

SUMMARY OF THE INVENTION

An improved two-stage differential sense amplifier with positive feedback in the first and second stages is disclosed.

The improved sense amplifier of the present invention includes a level shifting circuit that has a first input for receiving a true signal (IN) and a second input for receiving a complement signal (IN-bar). The level shifting circuit is coupled to a pre-amplification circuit that provides voltage gain to the true and complement signals. The pre-amplification circuit has a first output for generating an amplified true signal and a second output for generating an amplified complement signal. The improved sense amplifier of the present invention also includes a first driver circuit (e.g., an inverter), coupled to the pre-amplification circuit, having an input for receiving the amplified complement signal and an output for generating the output signal (i.e., the output of the first driver is coupled to the output port ($V_{out}$) of the sense amplifier). The first driver also includes a first port for receiving a first reference voltage, usually a power voltage signal, and a second port for receiving a second reference voltage, usually a ground signal. The present invention also includes a second driver (e.g., an inverter) that is coupled to the pre-amplification circuit. This second driver includes an input port for receiving the amplified true signal and an output port. This second driver also includes a first port for receiving the power supply voltage signal and a second port for receiving the ground signal. The second driver provides high gain for the sense amplifier.

The present invention also includes a first transistor that has a first electrode (e.g., a drain) coupled to the first reference voltage (e.g., the power supply voltage), a second electrode (e.g., a source) coupled to the first port of the first and second inverters and a third electrode (e.g., gate), which is employed to control current flow through the transistor. A second transistor has a first electrode coupled to the second port of the first and second inverters, a second electrode coupled to the second reference voltage (e.g., a ground signal) and a third electrode coupled to the output of the second inverter and the third electrode of the first and second transistor.

The improved sense amplifier of the present invention has several distinct advantages over the prior art sense amplifiers. First, the amplifier of the present invention accepts input signals at the power supply voltage. Second, the pre-amplifier of the present invention has a minimum number of transistors to minimize the input offset voltage. Third, the pre-amplifier of the present invention has low gain to minimize the propagation delay through the amplifier. Fourth, the second stage of the present invention has high voltage gain.

BRIEF DESCRIPTION OF DRAWINGS

The objects, features and advantages of the present invention will become apparent to one skilled in the art from reading the following detailed description in which:

FIG. 1b is a schematic diagram of the prior art sense amplifier of FIG. 1a.

DETAILED DESCRIPTION OF THE INVENTION

In the following detailed description of the present invention, numerous specific details (e.g., transistor sizes and process technologies) are set forth in order to provide a thorough understanding of the present invention. However, it will be obvious to one skilled in the art that the present invention may be practiced without these specific details. In other instances, well known electrical structures and circuits are shown in block diagram form in order not to unnecessarily obscure aspects of the present invention.

Although embodiments of the present invention are described in terms of Metal Oxide Semiconductor (MOS) transistors (i.e., p-channel and n-channel devices), it will be evident by those skilled in the art that the present invention may be implemented with different process technologies and different semiconductor devices. Specifically, it will be understood by those skilled in the art that a transistor has a first electrode, a second electrode, and a third electrode. The first electrode may be a source or a drain depending on the type of transistor employed. The second electrode is a drain or source, whichever the first electrode is not. The third electrode is a gate of the transistor that is employed to control the amount of current flowing through the transistor. The first and second electrodes form a current path for the transistor. In an NMOS transistor current flows from the drain to the source, whereas in a PMOS transistor, the current flows from the source to the drain.

It will also be evident to those skilled in the art that the first electrode and the second electrode may be a collector or an emitter, and the third electrode may be a base in a bipolar transistor. The collector and emitter in a bipolar transistor perform essentially the same function as the drain and source in a MOS transistor. Specifically, the collector and emitter form a current path for the bipolar transistor, and the base is employed to control the amount of current flowing through the current path.

Figure 1A:
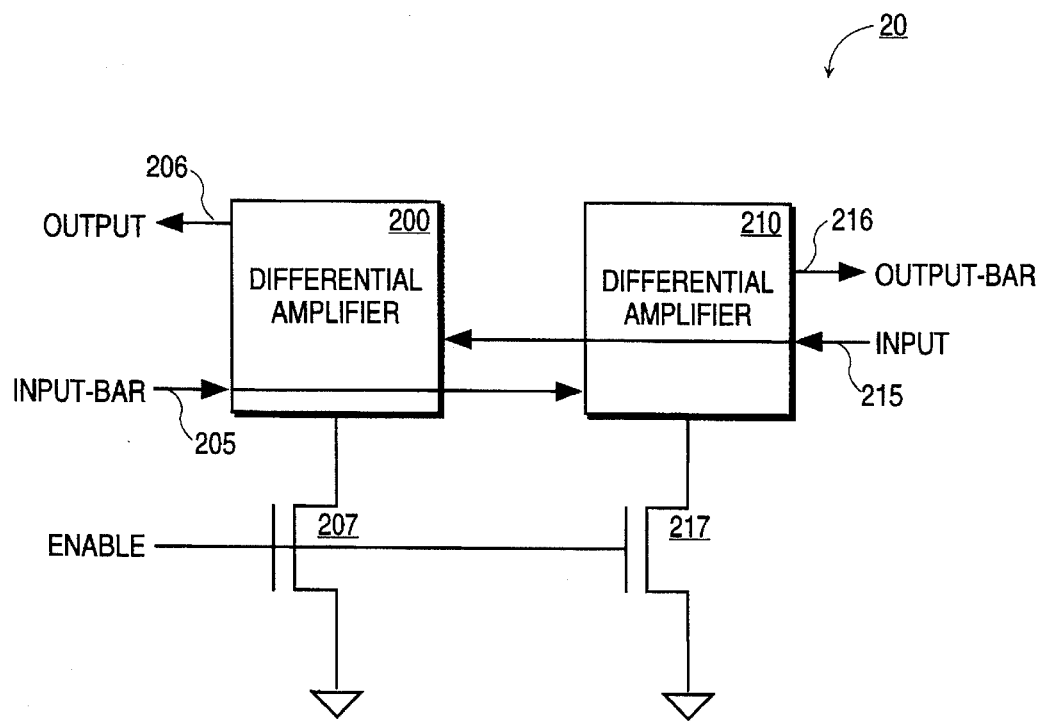
FIG. 1a is a simplified representation of a dual differential amplifier with differential outputs commonly used in the prior art sense amplifiers.
Figure 1B:
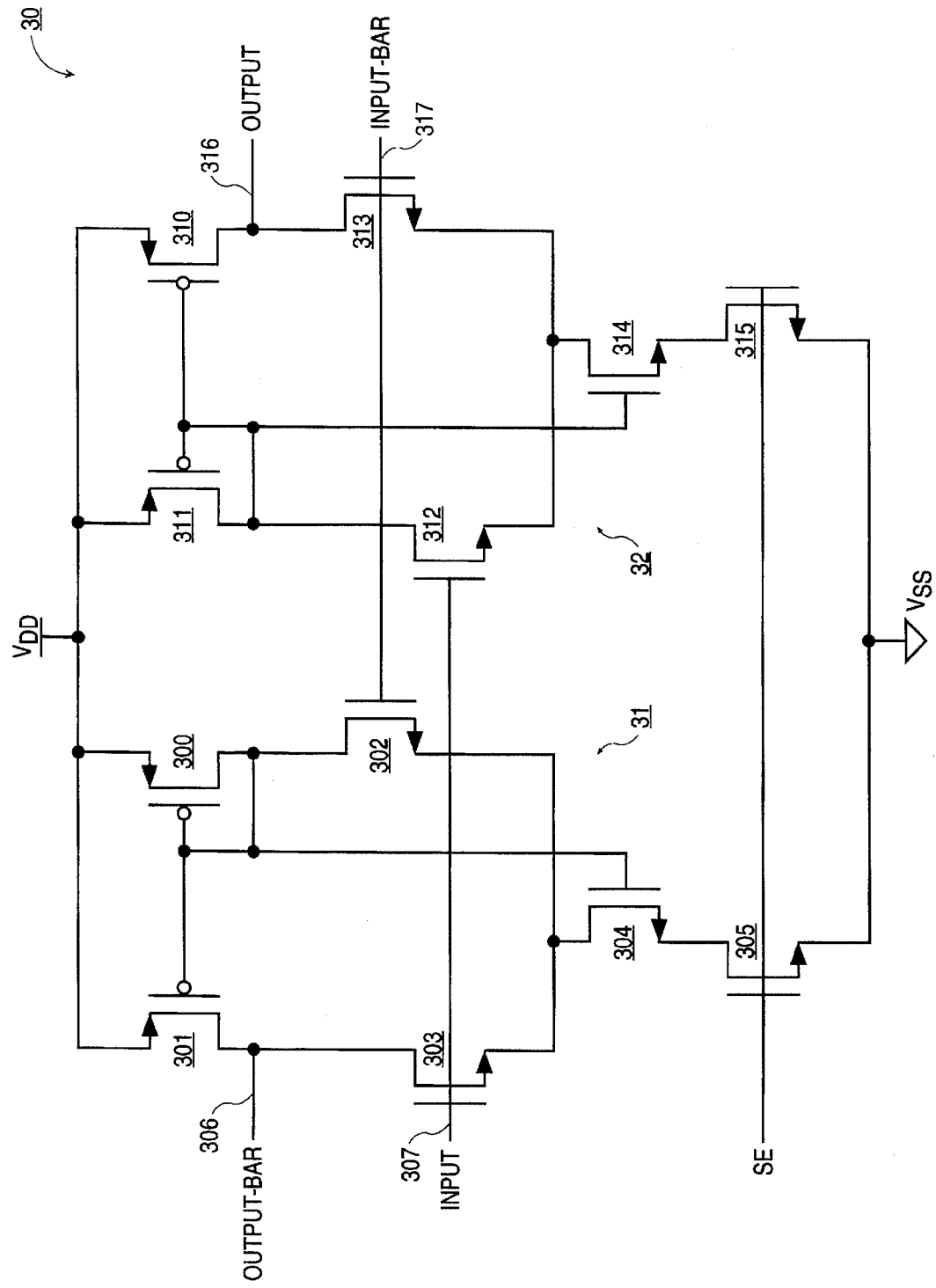
Figure 2:
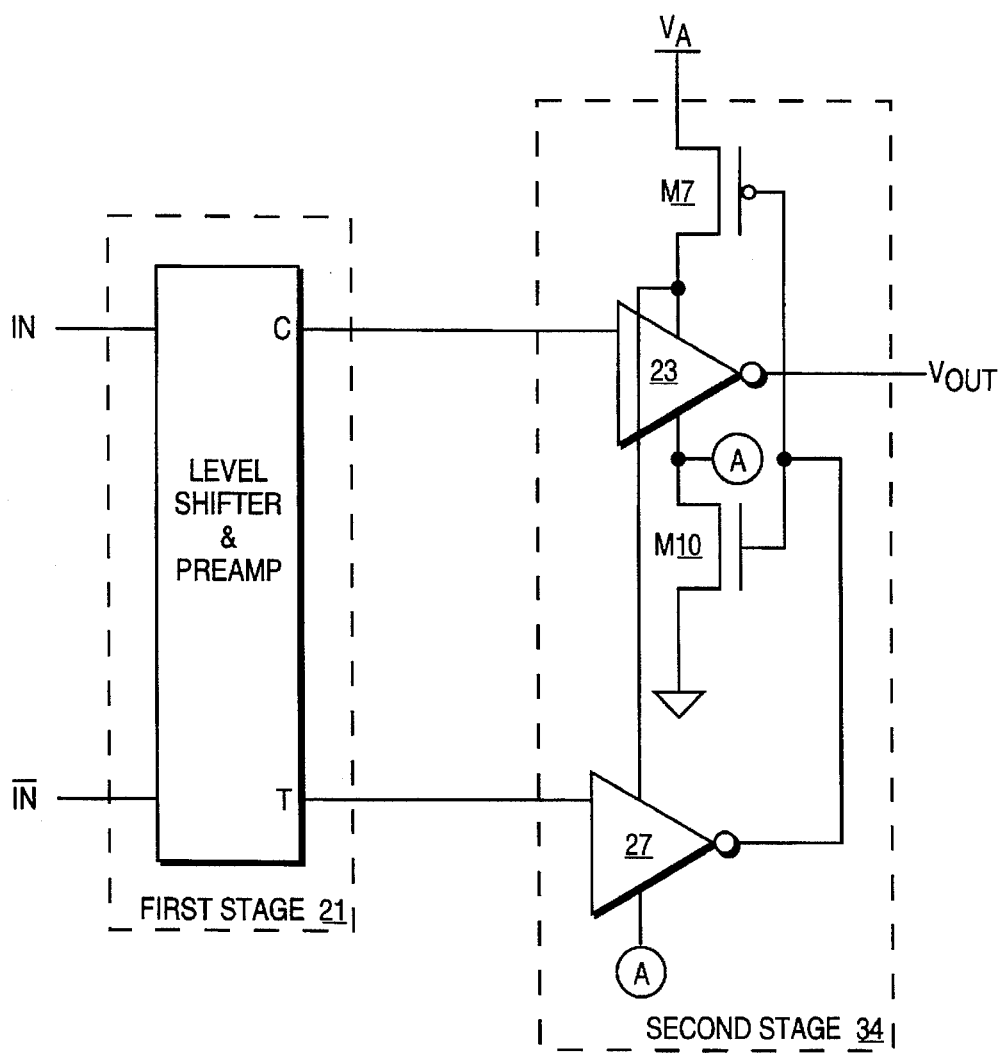
FIG. 2 illustrates a schematic diagram of the present invention.

FIG. 2 illustrates a schematic diagram of the present invention. The present invention is an improved two-stage differential sense amplifier with positive feedback in the first stage 21 and the second stage 34. The first stage 21 includes a level shifting and pre-amplification circuit for receiving the differential inputs (IN and $\overline{\text{IN}}$) and generating amplified true and complement signals. The second stage 34 includes a first driver, which in this embodiment of the present invention is a first inverter 23 that is coupled to the level shifting and pre-amplification circuit of the first stage 21. The first inverter 23 includes an input for receiving an amplified complement signal ($\overline{\text{IN}}$), and an output coupled to the output port ($V_{out}$) of the sense amplifier. The second stage 34 also includes a second driver, which in this embodiment of the present invention is a second inverter 27 that is also coupled to the level shifting and pre-amplification circuit of the first stage 21. The second inverter 27 has an input for receiving the amplified true signal (IN) and also has an output port.

Both the first inverter 23 and the second inverter 27 each have a first port for receiving a first reference voltage, such as a power voltage signal and a second port for receiving a second reference voltage, such as a $V_{ss}$ signal (e.g. ground signal). The first ports of the first and second inverters 23 and 27 are coupled to the first reference voltage (e.g., $V_{cc}$) through a first transistor M7. In the preferred embodiment, transistor M7 is a PMOS transistor. The ground port of the first and second inverters 23 and 27 is coupled to the $V_{ss}$ (e.g., ground) via a second transistor M10. In the preferred embodiment, transistor M10 is a MMOS transistor. The gates of transistors M7 and M10 are coupled to the output port of the second inverter 27.

Figure 3:
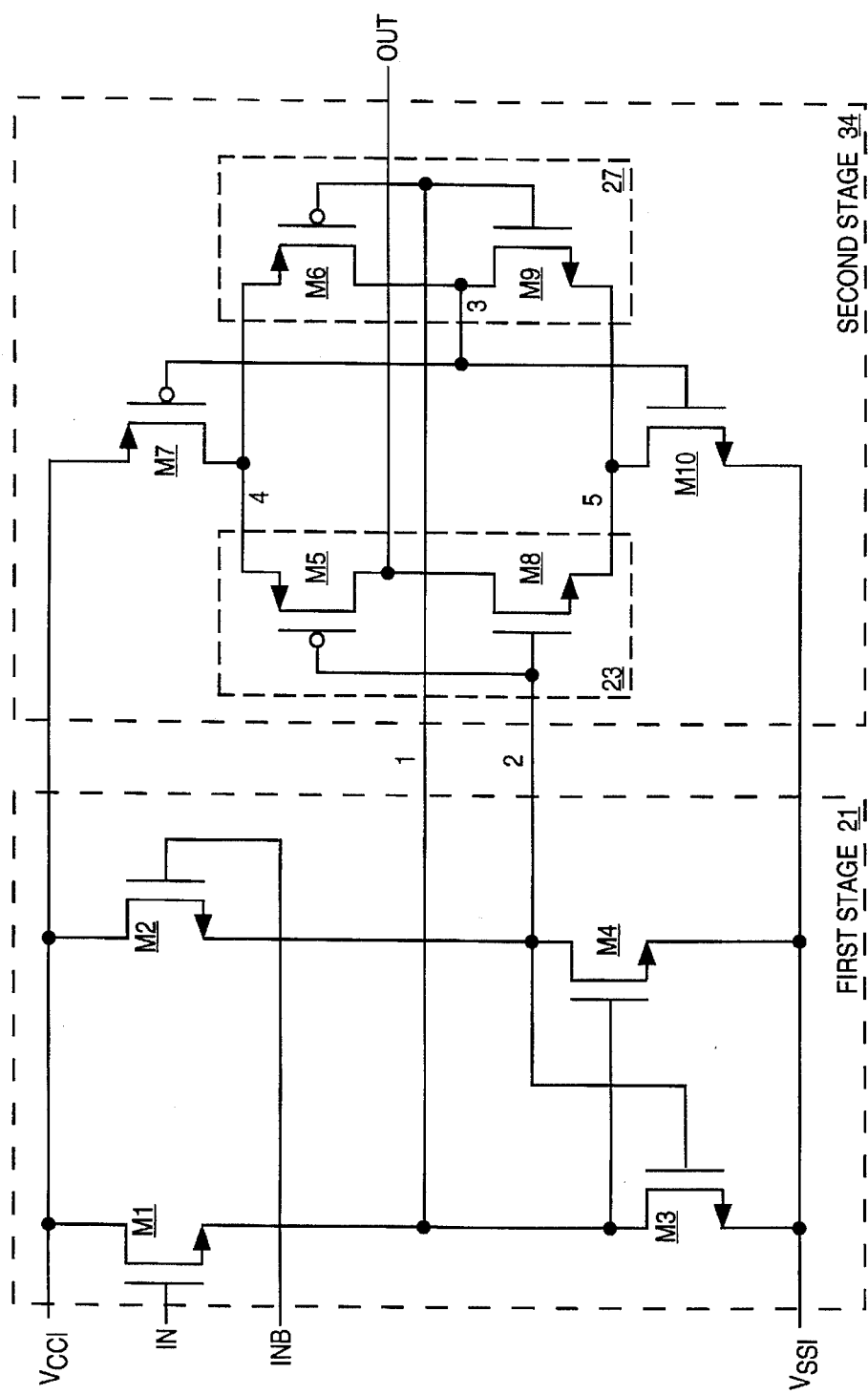
FIG. 3 illustrates a circuit diagram of the present invention.

FIG. 3 illustrates in greater detail the circuit elements of the present invention. As is conventional, the small circle on transistors (e.g., MS, M6 and M7) indicates that it is a p-channel transistor. Transistors (e.g., M1–M4, M8–10) without the small circle are, thus, n-channel transistors. Transistors M5 and M8, as well as transistors M6 and M9, are complementary transistor pairs. The gates of transistors M5 and M8 are connected together and also connected to node 2, as shown. The drains of transistors M5 and M8 are coupled together and also connected to the output port ($V_{out}$). The sources of transistors M5 and M8 connect respectively to node 4 and node 5. The drains of transistors M6 and M9 are coupled together and also connected to node 3. The source of transistor M6 and the source of transistor M9 connect respectively to node 4 and node 5.

The first stage 21 of the present invention includes transistors M1 and M2 for receiving the true and complement signals, respectively. Transistors M1 and M2 are known in the art as "source followers" that have their drains coupled to the power supply voltage ($V_{cc}$) and their sources coupled to the inputs for the second stage 34. Specifically, the source of transistor M1 is coupled to node 1 which is coupled to the gates of transistors M6 and M9 of the second stage 34. The source of transistor M2 is coupled to node 2, which is coupled to gates of transistors M5 and M8 of the second stage 34.

The first stage 21 also includes transistors M3 and M4 that are cross-coupled (i.e., having their gates tied to the drains of each other). Transistors M1 and M2 act as loads for transistors M3 and M4 in the first stage 21. Transistors M3 and M4 are connected in a positive feedback loop which provides gain for the first stage 21. Nodes 1 and 2 are outputs of the first stage 21 and inputs to the second stage 34.

The source followers M1 and M2 set the common mode voltage at node 1 and node 2 at approximately ½ the value of $V_{cc}$. Hence, transistors M1 and M2 provide a "level-shifting" function to establish the input voltages to the second stage 34.

Table 1 illustrates exemplary W/L values for the transistors employed in the present invention. W represents the width of the gate of the transistor in question, and L represents the length of the gate of that particular transistor. Unless otherwise noted, the W and L values are expressed in micron units (um). The W and L ratios illustrated in Table 1 are exemplary values that may be appropriate for certain applications.

Although in the preferred embodiment, the present invention is implemented using a 0.5 micron process, it is evident from Table 1 that transistors M1–M4 are sized using a 1 micron gate length. Although using a 1 micron gate length slightly increases the propagation delay through this part (i.e., slows the performance of this particular part), the use of the 1 micron gate length lowers the amount of current entering the second stage 34 and also provides a better matching of transistors M1–M4, which is useful for the proper operation of the present invention. Please refer to Table 1 for exemplary values of transistors M1–M4 that provide a proper "level-shifting" of nodes 1 and 2.

TABLE 1

| Transistor | W/L |
|---|---|
| M1 | 8/1 |
| M2 | 8/1 |
| M3 | 8/1 |
| M4 | 8/1 |
| M5 | 8/0.5 |
| M6 | 8/0.5 |
| M7 | 8/0.5 |
| M8 | 5/0.5 |
| M9 | 5/0.5 |
| M10 | 5/0.5 |

The second stage 34 includes a first inverter 23 made up of transistors M5 and M8. The gates of M5 and M8 are coupled to node 2, which reflects an amplified complement signal. If node were tied to ground or $V_{ss}$ and node 4 was tied to $V_{cc}$, the first inverter 23, including transistors M5 and M8, would provide an approximate gain of ten in one embodiment. The output port ($V_{out}$) of the present invention is coupled to the drain of transistor M8 and the drain of transistor M5 (i.e., the output of the first inverter 23).

The second stage 34 includes a second inverter 27 that includes transistors M6 and M9. The second inverter 27, if coupled to the rails ($V_{cc}$ and $V_{ss}$), would also produce an approximate gain of ten in one embodiment. However, the present invention ties the output of the second inverter 27 to the gates of M7 and M10. Transistor M10 provides a path to ground for node 5. Specifically, the drain of M10 is coupled to node 5, and the source of M10 is coupled to $V_{ss}$ (e.g., ground). Transistor M7 provides a path for node 4 to $V_{cc}$. Specifically, the source of transistor M7 is coupled to $V_{cc}$ and the drain is coupled to node 4.

The present invention utilizes the combination of transistors M6, M7, M9 and M10 to greatly increase the gain of the first inverter. This gain is generated by feeding back the output of the second inverter, which has as its input the amplified true signal (node 1) to the first inverter (M5 and M8) through transistors M7 and M10.

Figure 4:
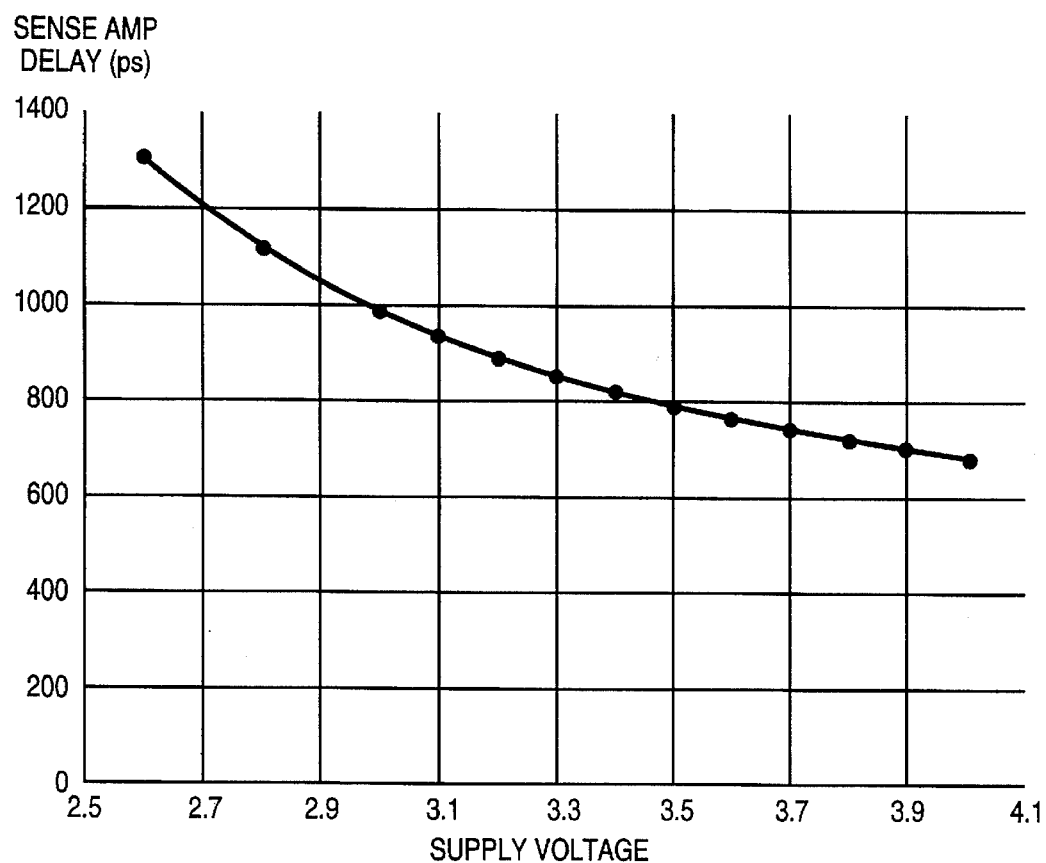
FIG. 4 illustrates a sense amplifier propagation delay versus the supply voltage.

FIG. 4 illustrates a graph of the propagation delay of the present invention versus the power supply voltage ($V_{cc}$). FIG. 4 illustrates results for a sense amplifier employing transistors sized in accordance with the values as specified in Table 1. The actual results may differ based on the process technology. The graphs in this application were generated using a circuit simulator.

As is evident from FIG. 4, the propagation delay through the sense amplifier in pico seconds (ps) decreases with an increasing power voltage supply ($V_{cc}$). For example, the propagation delay through the sense amplifier is approximately 1,200 pico seconds at a supply voltage of 2.7 V, whereas the propagation delay through the sense amplifier is approximately 700 pico seconds at a supply voltage of 3.9 V. It should be noted that the propagation delay through the sense amplifier is highly dependent on the process used. For example, it is well known in the art that the speed of a part (i.e., the propagation delay through the part) is directly proportional to the size of the gates of the transistors used. For example, if the width of a gate is halved, the part, as a rule of thumb, is twice as fast. The propagation delay is measured from the time the differential inputs cross to the time that the voltage at the output reaches 50% of the full range swing (i.e., $V_{cc}$–$V_{ss}$). The propagation delay is generally measured with an input of 100 millivolts (mV). The way to measure the propagation delay through a sense amplifier is known in the art.

Figure 5:
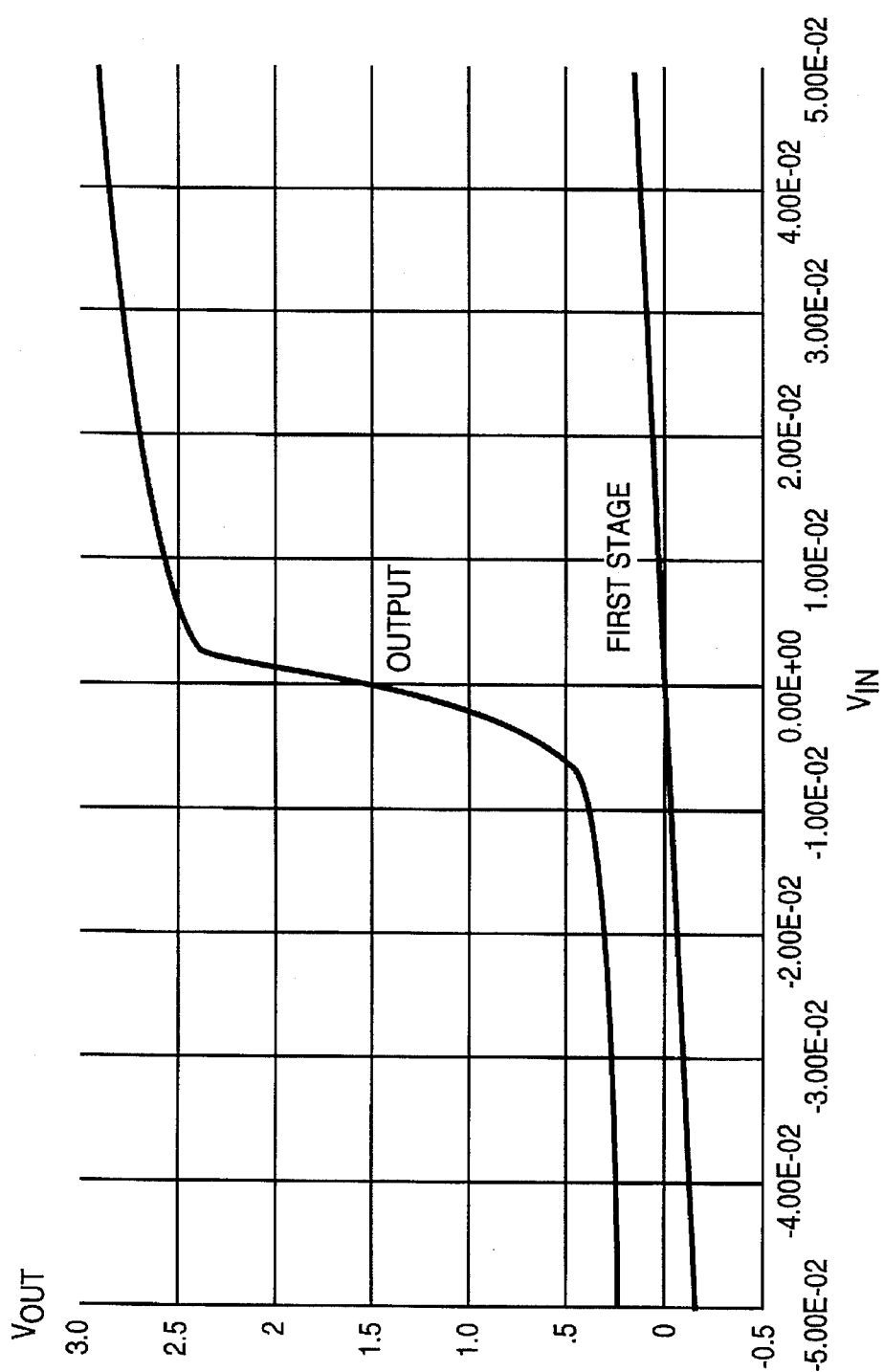
FIG. 5 illustrates a graph of $V_{in}$ versus $V_{out}$ for the first stage of the present invention and also the gain of the improved sense amp of the present invention.

FIG. 5 illustrates a graph of the $V_{in}$ versus $V_{out}$ (i.e., gain) of the first stage 21 of the present invention, as well as the overall gain of the improved sense amplifier. As is evident from FIG. 5, the gain through the first stage is approximately 4–5, whereas the gain through the sense amplifier, as a whole, is approximately 100–200. The vertical axis representing $V_{out}$ is divided into 0.5 V increments, and $V_{in}$ (the horizontal axis) is divided into 10 millivolts (mV) increments. As is well known in the art, the gain of an amplifier is simply $V_{out}/V_{in}$. As mentioned previously, the results said forth in FIG. 5 illustrates the gain of one exemplary embodiment of the present invention that employs transistors, which have the sizes illustrated in Table 1. The actual results with respect to the overall gain of the present invention may differ depending on the parameters discussed previously.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than restrictive.

What is claimed is:

1. A sense amplifier for receiving differential inputs and providing an output signal, said differential inputs including a true signal and a complement signal, said sense amplifier comprising:

a) a pre-amplification circuit, coupled to said differential inputs for providing gain to the true and complement signals, said pre-amplification circuit having a first output for generating an amplified true signal and a second output for generating an amplified complement signal;

b) a first driver, coupled to the pre-amplification circuit, having an input for receiving the amplified complement signal and an output for generating the output signal, said first driver including a first port for receiving a first reference voltage signal and a second port for receiving a second reference voltage signal;

c) a second driver, coupled to the pre-amplification circuit, having an input port for receiving the amplified true signal, a first port for receiving the first reference voltage signal, a second port for receiving the second reference voltage signal, and an output port for generating a first control signal; and d) a first transistor having a first electrode coupled to the first reference voltage signal, a second electrode to the first port of the first driver and a third electrode coupled to the output of the second transistor.

2. The sense amplifier as claimed in claim 1, further comprising a second transistor having a first electrode coupled to the second port of the first and second drivers, a second electrode coupled to the second reference voltage signal, and a third electrode coupled to the output of the second driver and the third electrode of the first transistor.

3. The sense amplifier as claimed in claim 1, wherein the first and second drivers are inverters.

4. A sense amplifier for receiving differential inputs and providing an output signal, said sense amplifier comprising:

a) a level shifting circuit having a first input for receiving a complement signal and a second input for receiving a true signal;

b) a pre-amplification circuit, coupled to the level shifting circuit for providing gain to the true and complement signals; said pre-amplification circuit having a first output for generating an amplified true signal and a second output for generating an amplified complement signal;

c) a first driver, coupled to the pre-amplification circuit, having an input for receiving the amplified complement signal and an output for generating the output signal, said first driver including a first port for receiving a first reference voltage signal and a second port for receiving a second reference voltage signal;

d) a second driver, coupled to the pre-amplification circuit, for receiving the amplified true signal and generating a first control signal;

e) a first transistor having a first electrode coupled to the first reference voltage signal and a second electrode coupled to the power port of the first driver and the second driver, said first transistor having a third electrode; and f) a second transistor having a first electrode coupled to the ground port of the first and second drivers and a second electrode coupled to the second reference voltage signal, said second transistor having a third electrode coupled to the output of the second driver the third electrode of the first transistor.

5. The sense amplifier of claim 4, wherein the first and second drivers are inverters.

* * * * *